INVENTORS
GEORGE D. RIVERS
DONALD H. LAPOINTE
BY Thomas S. Ross
Joseph R. Spalla
ATTORNEYS INVENTORS
GEORGE D. RIVERS
DONALD H. LAPOINTE
BY Thomas S. Ross
Joseph R. Spalla
ATTORNEYS Aug. 11, 1959 G. D. RIVERS ET AL 2,899,676

PRINTED CIRCUIT TRANSLATORS

Filed Dec. 9, 1957 3 Sheets-Sheet 3

INVENTORS
GEORGE D. RIVERS
DONALD H. LAPOINTE
BY Thomas S. Rose
Joseph R. Spalla
ATTORNEYS United States Patent Office 2,899,676

Patented Aug. 11, 1959

2,899,676

PRINTED CIRCUIT TRANSLATORS

George D. Rivers, Granby, and Donald H. Lapointe, Meriden, Conn., assignors to Royal McBee Corporation, Port Chester, N.Y., a corporation of New York Application December 9, 1957, Serial No. 701,579

8 Claims. (Cl. 340—347)

The present invention relates to translators for converting digital code groups of $n$ signals into $y$ dicrete signals where $y=2^n$; more particularly it relates to a translator construction employing printed circuits and switching elements translatable in response to digital code group signals for selectively connecting said printed circuits to complete current paths between a power source and discrete outputs.

Translators presently in use are either gas diode or relay translators. Both are complicated and expensive especially when designed to translate 5 or more level codes in that the former requires a large number of tubes and the latter a large number of relays and spring contact stacks; both necessitating a large number of cross connections. In addition both types occupy a relatively large volume which for many applications is prohibitive.

The instant invention is a small compact translator having a minimum of components which are easily and inexpensively manufactured and assembled. The unit of the invention comprises a pair of printed circuit cards mounted parallel to one another with the opposing sides carrying a plurality of isolated printed circuit conductors. A plurality of switching members are mounted for movement between the printed circuit cards to one another of two positions. Each of the switching members is responsive to signals representative of a predetermined binary order so that all of the switching elements are collectively responsive to digital code group signals representative of binary coded data. The printed circuit conductors on opposite cards are selectively connected in accordance with the digital code group signals received, thereby to complete current paths from a power source to one of a plurality of discrete output circuits.

A further feature of the invention resides in the fact that any form of binary coding may be translated inasmuch as the output signal resulting from particular digital code group signals may be arbitrarily designated as representative of any bit of data.

An object of the invention therefore is to provide a small compact translator having a minimum of easily manufactured and assembled components, which requires negligible maintenance.

Another object of the invention is the provision of a printed circuit translator capable of rapidly converting digital code groups of $n$ signals into $y$ discrete signals where $y=2^n$.

A further object of the invention is to provide a translator incorporating printed circuits in combination with switching elements movable in response to digital code group signals to effect selective connection of said printed circuits in accordance with the received signals.

A still further object of the invention is the provision of a printed circuit translator capable of translating any binary code.

A still further object of the invention is to provide a printed circuit translator wherein translation is accomplished by selectively connecting isolated printed circuits in accordance with input digital code group signals.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figure 1:
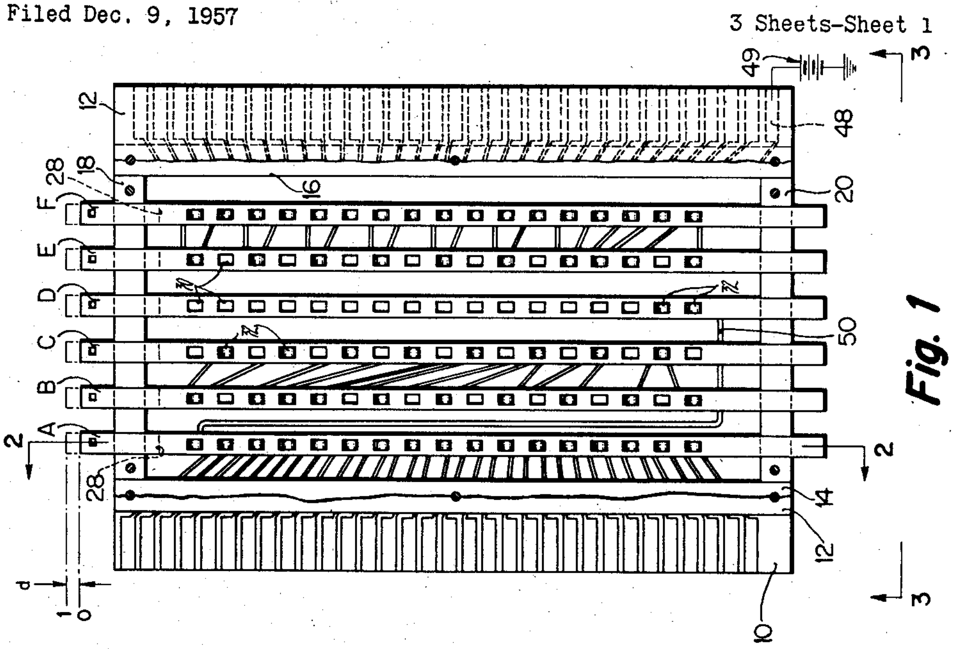
Fig. 1 shows a plan view with parts broken away of a translator constructed in accordance with the invention.
Figure 2:
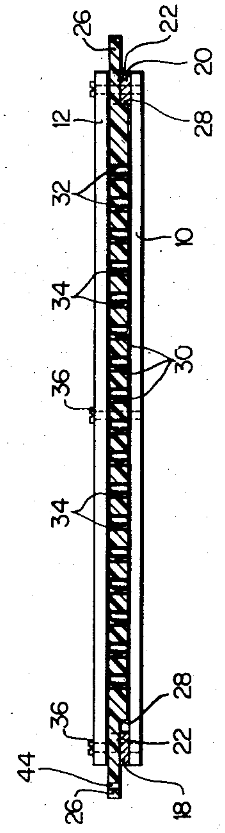
Fig. 2 is a cross sectional view taken along lines 2—2 of Fig. 1.
Figure 2A:
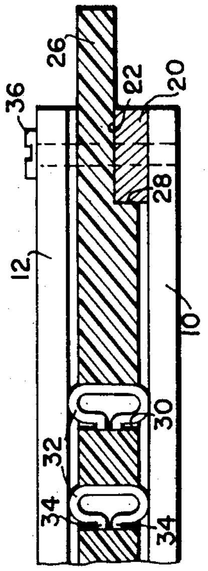
Figure 3:
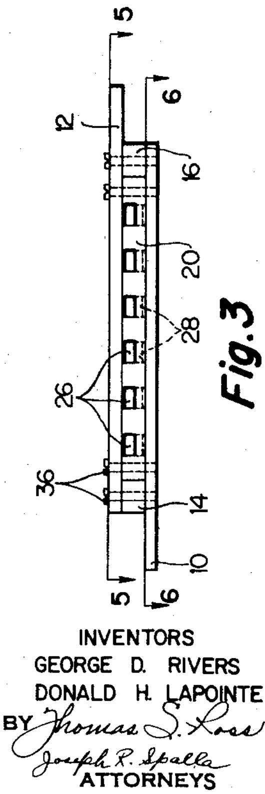
Figure 7:
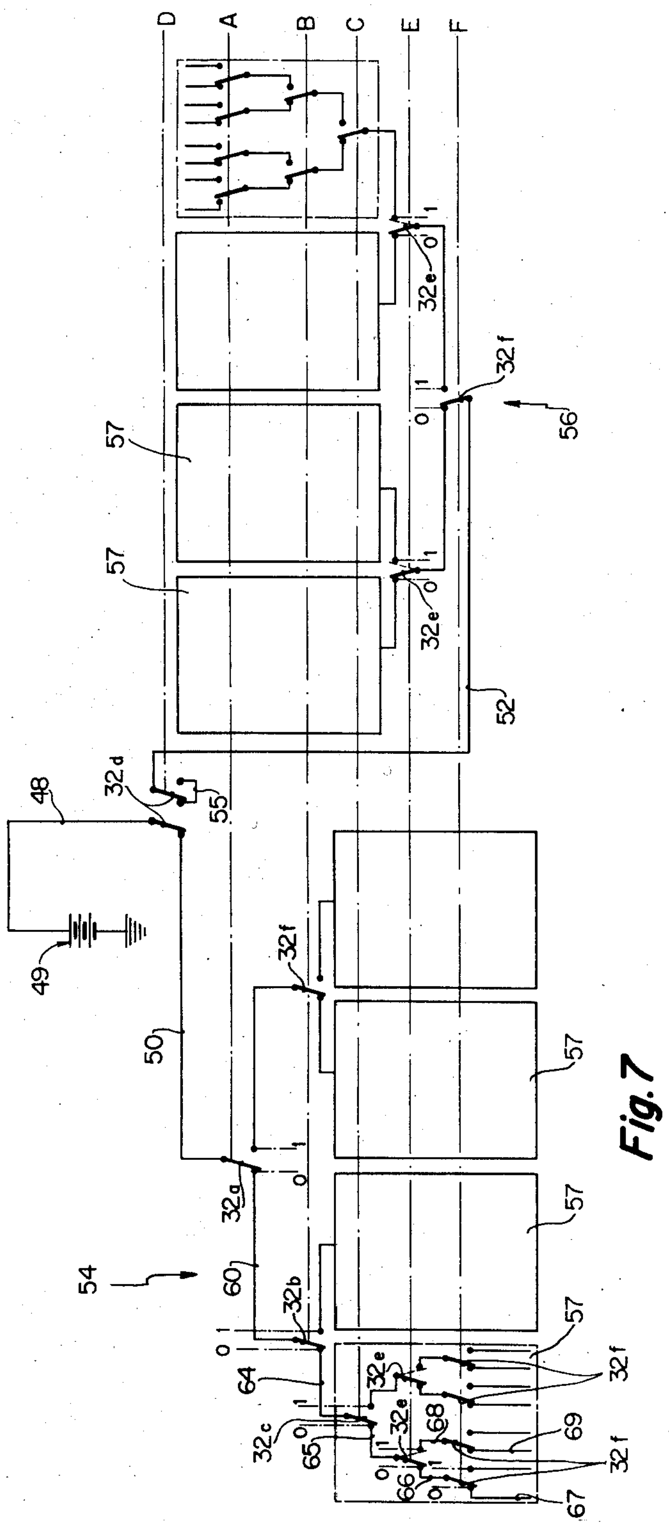
Figure 4:
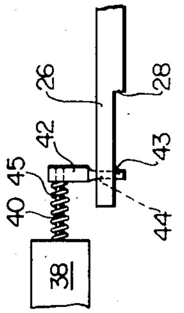
Figure 5:
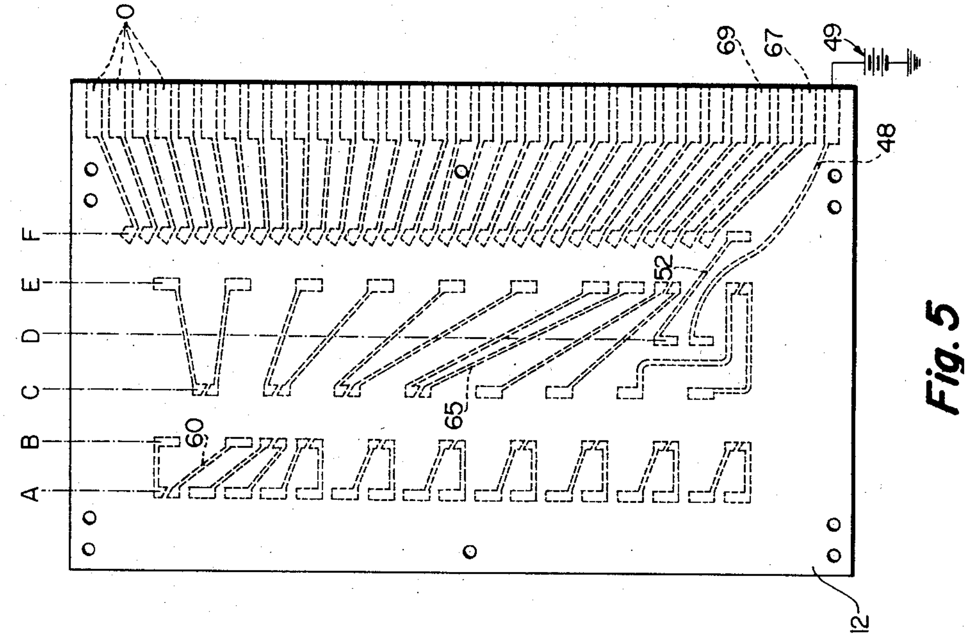
Figure 6:
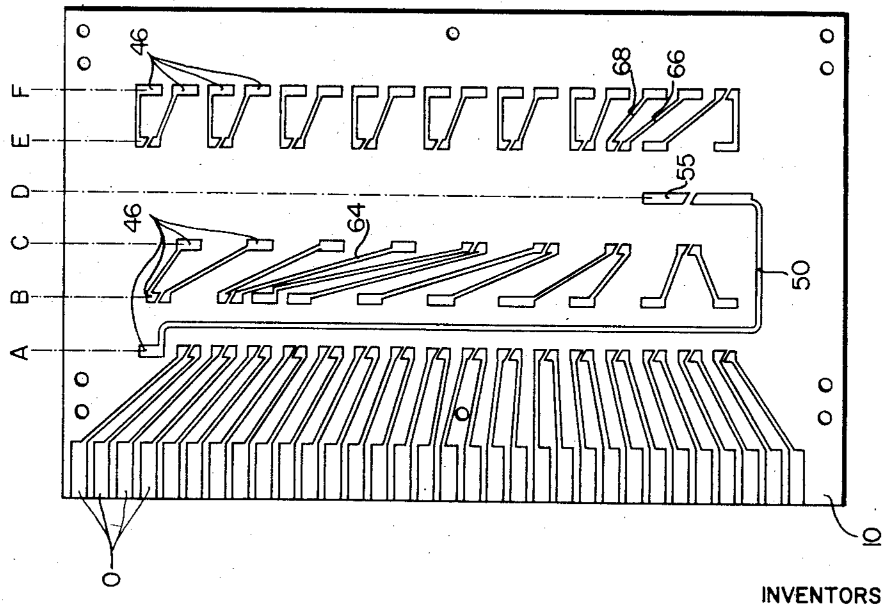

Fig. 2*a* is an enlarged fragmentary cross sectional view similar to Fig. 2 more clearly illustrating the contact mounting;

Fig. 3 is an end view of the translator taken along lines 3—3 of Fig. 1;

Fig. 4 shows an electromagnet and armature operatively connected to a switching beam;

Fig. 5 is a view taken along lines 5—5 of Fig. 3 showing the printed circuit pattern on the upper card;

Fig. 6 is a view along lines 6—6 of Fig. 3 showing the printed circuit pattern on the lower card which together with the printed circuit pattern on the upper card is adapted for decoding 6 level digital code groups; and Fig. 7 is a partially schematic block diagram representing the translator circuitry.

Referring now to the figures wherein like reference characters designate like or corresponding parts throughout the several views there is shown in Figs. 1–3 the construction of a translating unit in accordance with the invention. The unit comprises a pair of rectangular printed circuit cards 10 and 12 respectively. The cards are spaced in parallel relation by narrow rectangular side spacers 14 and 16 and by narrow rectangular end spacers 18 and 20 all of the same predetermined thickness. As shown in the figures a plurality of rectangular grooves 22 of predetermined depth equal in number to the number of levels in a code to be translated are cut into the surfaces of the end spacers 18 and 20 facing printed circuit card 12. During assembly elongated rectangular switching beams A, B, C, D, E and F having undercut ends 26 are mounted between the printed circuit cards with the undercut ends 26 supported by the grooves 22 in the end spacers. As is apparent from Fig. 2 the thickness of the beams is less than the thickness of the card spacers whereby the beams are free to move longitudinally. The longitudinal movement of the beams is limited by the shoulders 28 formed by the undercut ends which abut one or the other of end spacers 18 and 20 as the beams are moved to one or the other of two positions. Each of the switching beams has formed therein a plurality of rectangular holes 30. The holes 30 are adapted to receive in selected positions transfer contacts 32 formed from flat strip conductive material so as to have a substantially elliptical cross section. As most clearly shown in Fig. 2 one side of each of the elliptically formed transfer contacts 32 is cut and the ends 34 bent outwardly. With the beams mounted on the end spacers the upper printed circuit card is secured to the lower card by screws 36 or the like threaded into holes appropriately positioned in the cards and spacers. As seen in Fig. 2 and Fig. 2*a* the length of the major axes of the elliptically formed transfer contacts 32 are longer than the thickness of the beams so that the rounded ends extend beyond the beams and are compressed between the cards 10 and 12 to assure good electrical contact with the printed conductors on the cards. In addition, compression of the contacts 32 causes the ends 34 to be urged against and grip the walls of the holes 30. While the holes in the beams have been illustrated as rectangular and the contact members as conductive strips bent so as to have elliptical cross sections it is to be understood that the illustration is merely by way of example and that other modifications will be apparent to persons skilled in the art.

Each of the beams is adapted to be moved a distance (*d*) Fig. 1, between a "zero" and a "one" position by an electromagnet 38 and armature 40 (Fig. 4); the latter being coupled to the ends of the beams by any suitable means such as an actuator 42 whose end 43 is received by holes 44 formed in and adjacent the beam ends. As is apparent the number of electromagnets and beams operatively associated therewith will depend on the number of levels in the digital code groups to be translated. Electromagnets representative of predetermined binary levels will be energized or not depending on the presence or absence of a signal in a corresponding level of the digital code grouping to be translated.

The embodiment disclosed is a six level code translator requiring six beams. Each of the six beams A, B, C, D, E and F may arbitrarily represent any one of the six code levels i.e. $2^0$, $2^1$, $2^2$, $2^3$, $2^4$, and $2^5$. As shown in Fig. 4 the beams are normally retained in one of their two positions under the influence of armature return springs 45. When the electromagnets are selectively energized in accordance with particular code groupings, those beams associated with energized electromagnets will be moved to their other positions.

Referring now to Figs. 5 and 6 there are shown the complementary printed circuit patterns on cards 10 and 12 which are, in combination with the switching beams, adapted to translate six level binary code groups.

The printed conductors on the cards 10 and 12 are arranged such that they terminate in contact areas 46 aligned in one or more columnar positions on the card, i.e. positions A, B, C, D, E and F. When the cards are assembled corresponding columnar positions on the two cards are opposite one another with a corresponding switching beam between them. It may be seen from an inspection of the two printed circuit patterns that with the exception of the contact areas in columnar position D the aligned contact areas 46 in opposite columnar positions are of different sizes such that a relatively large contact area on one card is superimposed over two relatively smaller contact areas on the opposite card and vice versa. In accordance with the invention, the transfer contacts 32 on the switching beams will connect the relatively large contact areas 46 on one card with one or another of the two relatively small contact areas that are associated therewith on the opposite card depending on whether the beams associated with said opposite corresponding columns are in a "zero" or a "one" position.

In a six level binary code there are sixty four combinations as is understood in the art. In translating a six level code then, sixty four outputs must be provided. As shown in Figs. 1, 5 and 6, each card is provided with thirty two output conductors generally designated by reference character O which may be connected for example, to electromagnets adapted to actuate the keys of a business machine. Card 12 is also provided with an input conductor 48 which is adapted to be connected to a power source 49.

As will hereinafter more clearly appear power on input conductor 48 will be connected through the transfer contacts 32 carried by beam D to either conductor 50 or 52 on cards 10 and 12 respectively depending on the position of switching beam D. These conductors 50 and 52 are the starting points of switching trees generally designated 54 and 56 as shown in Fig. 7. Each of conductors 50 and 52 expands from one to two; two to four; four to eight; eight to sixteen; and sixteen to thirty two conductors. More specifically with switching beam D in its "zero" position current on conductor 48 will be switched through the lower transfer contact 32 on beam D to conductor 50 and will flow through tree 54 as will hereinafter more clearly appear from columnar position A on card 10 to columnar position B on card 12, to columnar position C on card 10, to columnar position E on card 12, to columnar position F on card 10 and to an output conductor on card 12. With switching beam D in its "one" position current on conductor 48 will be switched through the lower transfer contact 32 on beam D to contact area 55 on card 10 and through the upper transfer contact 32 on beam D to conductor 52 on card 12. Current on conductor 52 will flow through tree 56 from columnar position F on card 12 to columnar position E on card 10, to columnar position C on card 12, to columnar position B on card 10, to columnar position A on card 12, and to an output conductor on card 10.

Referring to Figs. 5, 6 and particularly Fig. 7 current paths will be traced to show the operation of the printed circuit translator. While only one eight output branch in each switching tree is shown in full in Fig. 7, it is to be understood that each box 57 represents an eight output branch. The circuit illustrated in Fig. 7 shows all the switching beams A–F in one of their two positions arbitrarily shown as the zero position and for purpose of clarity the transfer contacts bear the letter designation of the beams on which they are mounted. In the zero position then current flowing from the power source 49 to printed conductor 48 on card 12 will be switched by the lower transfer contact 32*d* (Fig. 7) to printed circuit conductor 50 on card 10. The current carried by conductor 50 will be switched by transfer contact 32*a* to conductor 60 on card 12. The current carried by conductor 60 will be switched by transfer contact 32*b* to conductor 64 on card 10. Transfer contact 32*c* will switch the current carried by conductor 64 to conductor 65 on card 12 and contact 32*e* will switch the current carried by conductor 65 to conductor 66 on card 10. Finally current on conductor 66 will be switched by transfer contact 32*f* to output conductor 67 on card 10.

As a further example, if beam E is moved to a "one" position, as illustrated by the dotted positions of contacts 32*e*, while all the other beams remain in a "zero" position, the current will flow as before up to transfer contact 32*e* in beam E which will switch the current carried by conductor 65 to conductor 68 on card 10 rather than conductor 66 and another of the transfer contacts 32*f* will switch the current carried by conductor 68 to output conductor 69 on card 12. It will be apparent from the above that when any one or more of the switching beams are moved from one to another position a current path from the power source will be provided to a discrete one of the 64 output conductors O.

As seen in Figs. 1–3 when the two cards are assembled with corresponding columnar positions opposite one another the cards will overlap. Inasmuch as the output conductors O are brought to the edges of their respective cards, connection of external circuitry thereto is facilitated.

It should be understood that the foregoing disclosure relates to only a preferred embodiment of the invention and that it is intended to cover all changes and modifications of the example of the invention herein chosen for the purposes of the disclosure, which do not constitute departures from the spirit and scope of the invention.

The invention claimed is:

1. A translator for decoding $n$ level code group signals into $y$ discrete output signals where $y=2^n$ comprising a plurality of isolated printed conductors arranged on the opposing faces of two cards fixedly spaced in parallel planes, said printed conductors being arranged so as to form together the branches of an $n$ level switching tree having an input conductor and $2^n$ output conductors, bi-positional level switching beams, contacts carried by each of said beams, said contacts on each of said beams connecting the branches of one level of said tree to branches in the next higher level of said tree, and means responsive to signals representing an $n$ level code for moving said switching beams whereby said input conductor is connected to one of said $2^n$ output conductors in accordance with the positional combination of said beams.

2. A binary code translator comprising a pair of printed circuit cards fixedly spaced in parallel planes, a plurality of isolated printed conductors on the opposing faces of said cards, said printed conductors on one card forming with the conductors on the other card the branches of a switching tree having an input and a plurality of outputs, a plurality of bi-position devices mounted between said spaced boards adapted to be moved to one or another of their two positions, contact means carried by each of said devices for selectively connecting the branch conductors on one of said boards to the branch conductors on the other of said boards so as to connect said input to a discrete one of said outputs, and means responsive to signals representing different levels in an $n$ level code for moving said bi-position devices to effect the connection of said input to others of said outputs.

3. A translator as recited in claim 2 wherein said contact means carried by said devices are compressed between said printed circuit boards so that they slidably engage the printed conductors thereon and whereby they are securely retained by said devices.

4. A printed circuit translator for translating $n$ level codes to $y$ discrete signals, where $y=2^n$, comprising a pair of printed circuit cards fixedly spaced in parallel planes, a plurality of isolated printed conductors on the opposing faces of said spaced cards, said printed conductors on one card forming with the conductors on the other card the branches of an $n$ level switching tree having an input conductor and $2^n$ output conductors, a plurality of bi-position elements each representative of one level in an $n$ level code and movable to one or the other of their two positions depending on the presence or absence of a signal in the corresponding level of the code to be translated, means for mounting said elements between said spaced cards, means responsive to said code signals for moving said elements, and contacts mounted on each of said elements for selectively interconnecting the printed branch conductors on said cards so as to form discrete current paths between said input conductor and one of said output conductors, the particular current path formed being dependent on the positions of said elements.

5. A printed circuit translator for translating $n$ level code group signals to $y$ discrete signals where $y=2^n$ comprising a pair of printed circuit cards fixedly spaced in parallel planes, a plurality of isolated printed conductors on the opposing faces of said cards, said conductors having terminal areas aligned in one or more of $n$ columnar positions, switching beams movably mounted between opposing columnar positions, means coupled to said switching beams responsive to signals representing the binary digits in code groups to be translated for moving said beams to one or another position, switching contacts carried by said beams for connecting predetermined ones of said printed circuit conductors between an energized conductor and one of $2^n$ output conductors when said beams are in one position and to others of said $2^n$ output conductors when said beams are selectively moved to other combinations of their two positions in accordance with the code group signals to be translated.

6. A printed circuit translator for translating $n$ level code group signals to $y$ discrete signals where $y=2^n$, comprising a pair of printed circuit cards fixedly spaced in parallel planes, a plurality of printed conductors including $2^n$ output conductors on the opposing faces of said cards, said conductors having terminal areas aligned in one or more of $n$ columnar positions, switching beams movably mounted between opposing columnar positions, contacts carried by said switching beams interconnecting terminal areas in opposing columns, and means for moving each of said switching beams to one or another position whereby said beams may have $2^n$ combinations of positions, said printed conductors being interconnected so as to form a first or a second switching tree having $2^{n-1}$ outputs depending on the position of one of said beams, selected ones of said printed conductors forming each of said trees being interconnected so as to form a current path between an energized conductor and one of said $2^{n-1}$ outputs depending on the positional combination of said other beams.

7. A printed circuit translator for translating $n$ level code group signals to $y$ discrete signals where $y=2^n$ comprising a pair of printed circuit cards spaced in parallel planes, a plurality of isolated printed conductors on the opposing faces of said cards, $2^{n-1}$ output conductors on each card, a conductor adapted to be connected to a power source on one of said cards, all of said conductors having terminal areas aligned in one or more of $n$ columnar positions, said cards being disposed so that the aligned terminal areas on one card are opposite two aligned terminal areas on a corresponding columnar position on the other card, beams movably mounted between corresponding columnar positions, said beams being movable in response to the presence of signals in one of the levels of an $n$ level code whereby said beams have $2^n$ positional combinations, contacts carried by each of said switching beams for connecting the terminal areas forming a columnar position on one card with one or the other of the two terminal areas associated therewith on the other card depending on the position of said beams, said contacts and conductors forming one of two switching trees having $2^{n-1}$ output conductors depending on the position of one of said beams, said conductor adapted to be energized being connected to one or the other of said trees through the contacts on said last mentioned beam, the particular one of the $2^{n-1}$ outputs of said trees connected to said energized conductor being dependent on the positional combination of said other beams.

8. A compact translator for decoding $n$ level code group signals into $y$ discrete output signals where $y=2^n$ comprising a plurality of isolated printed conductors arranged on the opposing faces of two cards fixedly spaced in parallel planes, said printed conductors being arranged so as to form the branches of two $n$–1 level switching trees having an input conductor and two groups of $2^{n-1}$ output conductors, said two groups of $2^{n-1}$ output conductors being on opposite cards, a bi-positional switching beam for each level of the $n$ level code to be translated, contacts carried by one of said beams for connecting said input conductor to one or the other of said switching trees, and contacts carried by each of said other beams for selectively connecting branch conductors comprising successive levels of said trees whereby a current path is formed from said input conductor to one of the $2^{n-1}$ output conductors, the successive branch levels of said trees being alternately formed on said opposing cards.

References Cited in the file of this patent

UNITED STATES PATENTS

| | | |
|---|---|---|
| 970,367 | Blos | Sept. 13, 1910 |
| 1,981,987 | Bryce | Nov. 27, 1934 |
| 2,817,824 | Albright | Dec. 24, 1957 |

FOREIGN PATENTS

| | | |
|---|---|---|
| 732,221 | France | June 14, 1932 |